(12) United States Patent
Li

(10) Patent No.: US 9,907,202 B2
(45) Date of Patent: Feb. 27, 2018

(54) ELECTRONIC EQUIPMENT

(71) Applicants: BOE TECHNOLOGY GROUP CO., LTD., Beijing (CN); BEIJING BOE MULTIMEDIA TECHNOLOGY CO., LTD., Beijing (CN)

(72) Inventor: Pei Li, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 55 days.

(21) Appl. No.: 14/890,804

(22) PCT Filed: Apr. 21, 2015

(86) PCT No.: PCT/CN2015/077033
§ 371 (c)(1),
(2) Date: Nov. 12, 2015

(87) PCT Pub. No.: WO2016/115785
PCT Pub. Date: Jul. 28, 2016

(65) Prior Publication Data
US 2016/0360640 A1   Dec. 8, 2016

(30) Foreign Application Priority Data
Jan. 20, 2015   (CN) ............ 2015 2 0039825 U

(51) Int. Cl.
*H05K 7/20* (2006.01)
*H01F 7/06* (2006.01)
(Continued)

(52) U.S. Cl.
CPC ........ *H05K 7/20145* (2013.01); *H01F 7/064* (2013.01); *H02K 37/12* (2013.01);
(Continued)

(58) Field of Classification Search
CPC .................. H05K 7/20145; H05K 7/20181
See application file for complete search history.

(56) References Cited

U.S. PATENT DOCUMENTS 8,625,274 B2 * 1/2014 Lin .................. G06F 1/206
361/679.46
2005/0286241 A1   12/2005 Tsai
2011/0043995 A1   2/2011 Chen et al.

FOREIGN PATENT DOCUMENTS

CN   2059293 U   7/1990
CN   1921588 A   2/2007
(Continued)

OTHER PUBLICATIONS

International Search Report and Written Opinion both dated Jul. 3, 2015; PCT/CN2015/077033.

*Primary Examiner* — Adrian S Wilson
(74) *Attorney, Agent, or Firm* — Ladas & Parry LLP

(57) ABSTRACT

An electronic equipment, including: a housing provided with ventilation holes, and a movable baffle; wherein where the electronic equipment is not in operation, the movable baffle is in a first state, the ventilation holes on the housing are shielded by the movable baffle; and where the electronic equipment is working, the movable baffle is moved to a second state to enable the ventilation holes on the housing to ventilate and dissipate heat.

9 Claims, 3 Drawing Sheets

(51) Int. Cl.
*H02K 37/12* (2006.01)
*H05K 5/02* (2006.01)

(52) U.S. Cl.
CPC ....... *H05K 5/0213* (2013.01); *H05K 7/20181* (2013.01); *H05K 7/20954* (2013.01)

(56) References Cited

FOREIGN PATENT DOCUMENTS

| | | | |
|---|---|---|---|
| CN | 1933711 | A | 3/2007 |
| CN | 101770101 | A | 7/2010 |
| CN | 101995914 | A | 3/2011 |

* cited by examiner

ELECTRONIC EQUIPMENT

TECHNICAL FIELD

Embodiments of the present disclosure relate to an electronic equipment.

BACKGROUND

TV set is a common electronic equipment in daily life, in order to solve the problem of the heat dissipation of the components inside the TV set, it is a simple and effective method to provide ventilation holes on housing of the TV set, but providing ventilation holes is adverse to dust proof.

According to the statistics, about 60 percent of the TV set faults are caused by dust and oil depositing inside, this is because dust and oil have a corrosive effect on the components of the TV set, causing the components to be damaged due to gradually physical and chemical reaction. In addition, dust and oil can also easily result in the formation of a semi-short circuit state between the components, so when the humidity and temperature indoor become high, short circuit is prone to occur between the components, causing the TV set fault.

If the ventilation holes become small, the heat dissipation effect will be degraded, the high temperature inside is more likely to cause machine fail; while providing a fan or other devices in the TV set to blow dust out is easy to generate noise, which is not suitable for equipments such as the TV set and the like.

SUMMARY

At least one embodiment of the present disclosure provides an electronic equipment, comprising: a housing which is provided with ventilation holes, and a movable baffle; and where the electronic equipment is not in operation, the movable baffle is in a first state, the ventilation holes on the housing are shielded by the movable baffle; and where the electronic equipment is in operation, the movable baffle is moved to a second state to enable the ventilation holes on the housing to ventilate and dissipate heat normally.

In one embodiment according to the present disclosure, the movable baffle is provided with through holes corresponding to the ventilation holes; where the movable baffle is in the first state, the position of the through holes on the movable baffle is staggered the position of the ventilation holes on the housing; and where the movable baffle is moved to the second state, the position of the through holes on the movable baffle and the position of the ventilation holes on the housing are coincided with each other, and the ventilation holes on the housing can ventilate and dissipates heat normally.

In one embodiment according to the present disclosure, the movable baffle has a structure of shutter; where the movable baffle is in the first state, the movable baffle corresponds to a closed state of the shutter, and the ventilation holes on the housing are shielded; and where the movable baffle is moved to the second state, the movable baffle corresponds to an open state of the shutter, and the ventilation holes on the housing are open and can ventilate and dissipate heat normally.

In one embodiment according to the present disclosure, the electronic equipment further comprises: a driving mechanism which is driven by the ON/OFF signal of the electronic equipment and controls the movable baffle to be switched between the first state and the second state.

In one embodiment according to the present disclosure, the driving mechanism comprises: a coil; a switching component which controls whether the coil is powered or not; a magnet provided on one end of the movable baffle adjacent to the coil, and the magnet being rigidly connected with the movable baffle; a spring, one end of which is fixed and the other end of which is connected with the end of the movable baffle away from the magnet; and a first stop post, wherein where the movable baffle is at the position defined by the first stop post, the movable baffle is in the second state, and where the spring is in an initial position, the movable baffle is in the first position.

In one embodiment according to the present disclosure, the first stop post is a column shaped protrusion provided on the housing and is provided on a moving path of the movable baffle.

In one embodiment according to the present disclosure, the housing and the first stop post are integrally formed.

In one embodiment according to the present disclosure, the driving mechanism comprises: a stepping motor connected with the movable baffle through a transmission mechanism.

In one embodiment according to the present disclosure, the electronic equipment is a TV set or a display.

The electronic equipment according to embodiments of the present disclosure provides the movable baffle at the ventilation holes of the housing; where the electronic equipment is not in operation, the movable baffle is in the first state, the ventilation holes on the housing are shielded by the movable baffle, and dust cannot fall inside the equipment through the ventilation holes; and where the electronic equipment is in operation, the movable baffle is moved to the second state to enable the ventilation holes on the housing to ventilate and dissipate heat normally. In this way, it can improve performance of dust proof of the equipment, and do not affect the heat dissipation effect of the equipment, thus improving the reliability of the circuit board of the equipment and prolonging its service life.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
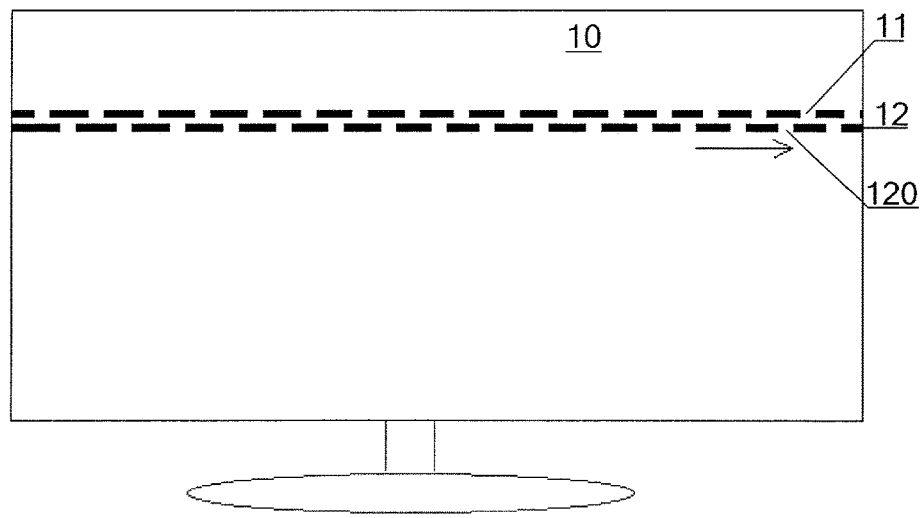
FIG. 1 is a schematic structural view of an electronic equipment according to the embodiment of the present disclosure in an OFF state.
Figure 2:
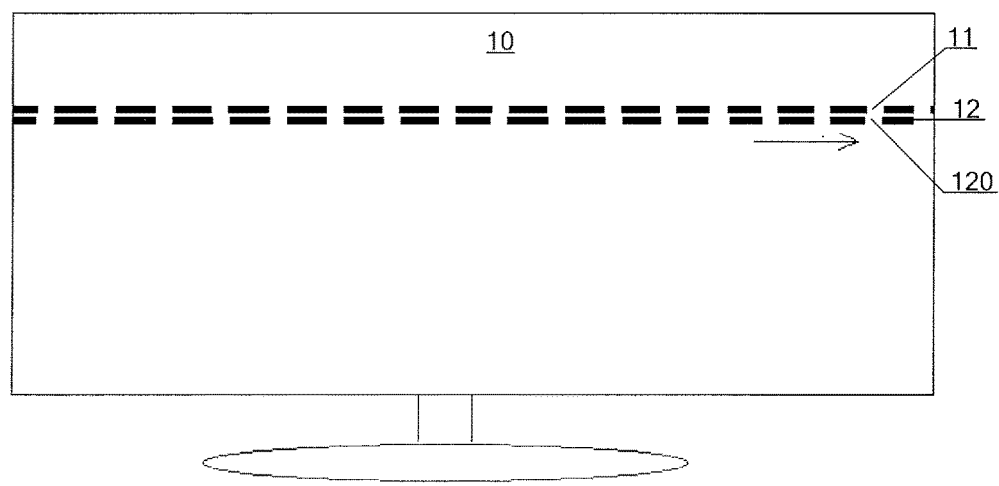
FIG. 2 is a schematic structural view of an electronic equipment according to the embodiment of the present disclosure in an ON state.

At least one embodiment of the present disclosure provides an electronic equipment, as illustrated in FIGS. 1 and 2, the electronic equipment (for example, a TV set illustrated in the figure) comprises: a housing 10 which is provided with ventilation holes 11, and a movable baffle 12; and where the electronic equipment is in operation, the movable baffle 12 is in the first state to enable the ventilation holes 11 on the housing 10 to ventilate and dissipate heat normally; and where the electronic equipment is in operation, the movable baffle 12 is moved to the second state, the ventilation holes 11 on the housing are shielded by the movable baffle 12.

The electronic equipment according to this embodiment provides the movable baffle 12 at the ventilation holes 11 of the housing 10, where the electronic equipment is not in operation, the movable baffle 11 is in the first state, causing the ventilation holes 11 on the housing 10 to be shielded by the movable baffle 12, i.e., the movable baffle 12 closes the ventilation holes 11, and dust cannot fall inside the equipment through the ventilation holes 11; and where the electronic equipment is in operation, the movable baffle 12 is moved to the second state from the shielding position to enable the ventilation holes 11 on the housing 10 to ventilate and dissipate heat normally, at this time, hot gas outflows from the ventilation holes 11, and a difference between the gas pressures inside and outside the equipment will make the dust fall on the housing or on the movable baffle 12, thus improving performance of dust proof of the equipment without affecting the heat dissipation effect of the equipment, thereby improving the reliability of the circuit board of the equipment and prolonging its service life.

The switch of the movable baffle 12 between the first state (corresponding to the ventilation holes 11 being shielded by the movable baffle 12) and the second state (corresponding to ventilation holes 11 ventilating and dissipating heat normally) can be achieved by a variety of ways, and this embodiment does not make any limitations. Accordingly, the movable baffle 12 can have a variety of structures. For example, the movable baffle 12 can be a single piece of plate, and can also be constituted of a plurality of mutual independent separated structures; the switch of the movable baffle 12 between the first state and the second state can be achieved by changing the position of the movable baffle 12, including moving, rotating and so on, and can also be achieved by other ways such as changing the shape itself, and the state of the baffle.

In one embodiment of the present disclosure, the movable baffle 12 is provided with through holes 120 corresponding to the ventilation holes 11. Where the movable baffle 12 is in the first state, as illustrated in FIG. 1, the position of the through holes 120 on the movable baffle 12 is staggered the position of the ventilation holes 11 on the housing, and dust cannot fall inside the equipment through the ventilation holes 11, so an enclosed space blocking dust is formed inside the equipment; and when the movable baffle 12 is moved leftward (or rightward, upward or downward), the movable baffle 12 is in the second state, at this time, the position of the through holes 120 on the movable baffle 12 and the position of the ventilation holes 11 on the housing are coincided with each other, as illustrated in FIG. 2, the positions of the holes are generally concentric, i.e., the center of ventilation hole and the center of through hole are on the same straight line, the ventilation holes 11 on the housing communicate with the external environment, and the ventilation holes 11 can ventilate and dissipate heat normally. The position change of the movable baffle 12 is small, which can be easily implemented and easily controlled.

In another embodiment of the present disclosure, the movable baffle 12 has a structure of shutter, where the electronic equipment is not in operation, the movable baffle 11 corresponds to a closed state of the shutter, and the ventilation holes 11 are closed, dust cannot fall inside the equipment through the ventilation holes 11; and where the electronic equipment is in operation, the movable baffle 11 corresponds to an open state of the shutter, and the ventilation holes 11 on the housing 10 can ventilate and dissipate heat normally.

Furthermore, the electronic equipment as described in this embodiment can further comprise a driving mechanism controls the movable baffle 12 to be switched between the first state and the second state.

The power on/off operation of the user is directly converted to a switch for the movable baffle 12 between the first state and the second state in the background. For example, the OFF signal corresponding to the power off operation controls the driving mechanism directly, or the OFF signal controls the driving mechanism after conversion, which drives the movable baffle 12 to be in the first state, causing the ventilation holes 11 on the housing 10 to keep the shielded state by the movable baffle 12, thereby dust cannot fall inside the equipment through the ventilation holes 11; when performing the power on operation, the ON signal corresponding to the power on operation controls the driving mechanism directly, or the ON signal controls the driving mechanism after conversion, which switches the movable baffle 12 to the second state, i.e., controls the driving mechanism to drive the movable baffle 12 to be moved away from the shielding position, so as to enable the ventilation holes 11 on the housing 10 to ventilate and dissipate heat normally, this can improve the dust proof performance of the equipment, and do not affect the heat dissipation effect of the equipment, thus improving the reliability of the circuit board of the equipment and prolonging its service life.

One of ordinary skill in the art can understand that, the driving mechanism can be realized in a variety of ways, and can also be associated with the structure of the movable baffle 12, embodiments of the present disclosure do not impose any limitations on the riving mechanism, which can be realized by any implementation well-known to those skilled in the art.

In order to make those skilled in the art understand better the driving mechanism in embodiments of the present disclosure and the technical solution of the present disclosure, the present disclosure will be described in detail by means of embodiments in the following. As illustrated in FIGS. 1 and 2, the movable baffle 12 is provided with through holes 120 corresponding to the ventilation holes 11, in the first state, the position of the through holes 120 on the movable baffle 12 is staggered the position of the ventilation holes 11 on the housing; and in the second state, the position of the through holes 120 on the movable baffle 12 and the position of the ventilation holes 11 on the housing are coincided with each other, and the ventilation holes 11 can ventilate and dissipate heat normally, which will be no longer described in detail below.

Figure 3:
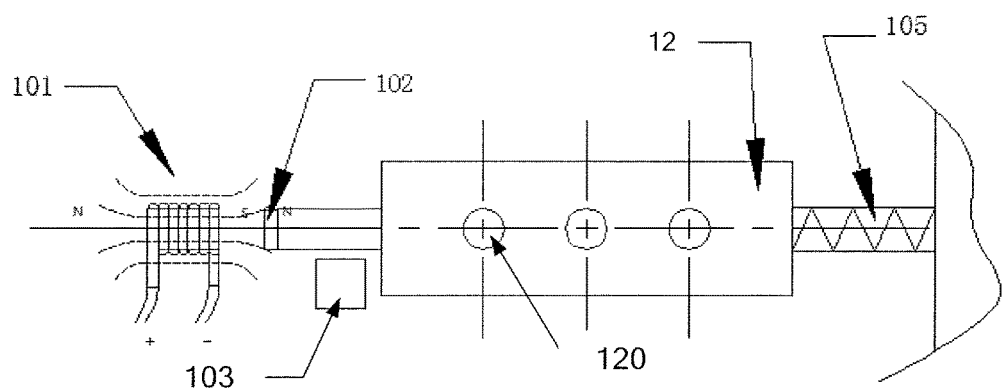
FIG. 3 is a schematic view of a driving mechanism according to the embodiment of the present disclosure.
Figure 4:
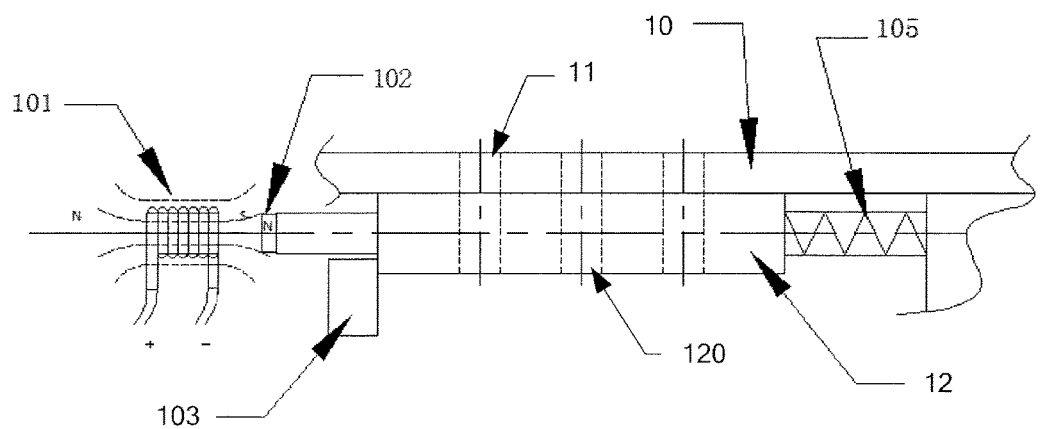
FIG. 4 is a schematic structural cross-section view of the electronic equipment employing the driving mechanism as illustrated in FIG. 3 in the ON state.
Figure 5:
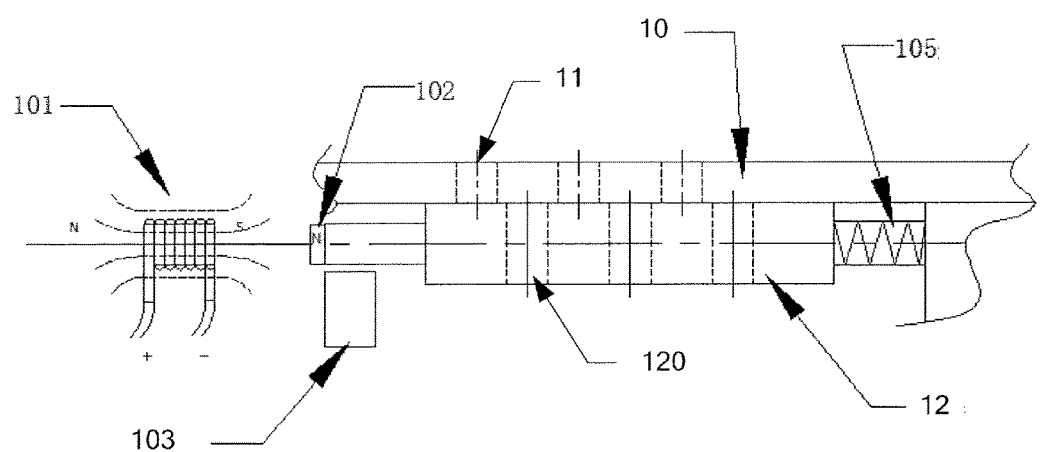
FIG. 5 is a schematic structural cross-section view of the electronic equipment employing the driving mechanism as illustrated in FIG. 3 in the OFF state.

As illustrated in FIGS. 3 to 5, the driving mechanism in this embodiment comprises: a coil 101 and a control component (not illustrated in the figure, it can be a control component like the switch) which controls whether the coil 101 is powered or not; a magnet 102 provided on one end (i.e., the end provided with the magnet 102) of the movable baffle 12 adjacent to the coil 101, and the magnet 102 being rigidly connected with the movable baffle 12; a spring 105, one end of which is fixed and the other end is connected with the end of the movable baffle 12 away from the magnet 102 (i.e., the end not provided with the magnet 102); and a first stop post 103, wherein when the movable baffle 12 is at the position defined by the stop post 103, the movable baffle 12 is in the second state, and when the spring is in an initial position, the movable baffle 12 is in the first state.

In this embodiment, when the spring is in the initial position, the movable baffle 12 is in the first state; When the coil 101 is powered, a magnetic field is generated, and an attractive or repulsive force is generated between the magnet and the coil, which drives the movable baffle 12 to move, then the movable baffle 12 switches to the second state.

For example, as illustrated in FIG. 4, the complete machine is powered after power on, the coil 101 is also powered and the magnetic field is generated, after the magnet 102 sensing the magnetic field generated by the coil 101, according to the principle of opposites attract (when the coil 101 is powered, N, S poles of the magnet are as shown in the Figure), the attractive force is greater than the pulling force of the spring 105, the movable baffle 12 produces a lateral displacement and is retained when reaching the position of the stop post 103, to maintain a balanced state. When reaching such retained position, the positions of the ventilation holes 11 on the housing 10 and the through holes on the movable baffle 12 are concentric, i.e., the ventilation holes 11 keep open, hot gas can be discharged from the ventilation holes 11, dust will not fall into the equipment due to the negative pressure generated by the principle of thermal transpiration.

As illustrated in FIG. 5, when the power of the complete machine is cut off, the coil 101 has no magnetic attraction force any longer due to power off, the movable baffle 12 restores to the initial position under the action of the pulling force of the spring 105, the position of the ventilation holes 11 on the housing 10 is staggered the position of the through holes 120 on the movable baffle 12 and have no coincided area, and dust is blocked outside the complete machine.

For example, the stop post 103 is a column shaped protrusion provided on the housing 11 and is located on the moving path of the movable baffle 12. The housing 11 and the column shaped protrusion provided on the housing 11 can be formed integrally.

This embodiment realizes the switch between the states of movable baffle 12 by directly using the corresponding power on/power off in the ON/OFF operation, so that where the electronic equipment is not in operation, the ventilation holes on the housing are shielded by the movable baffle; and where the electronic equipment is in operation, the movable baffle is moved away from shielding position, to enable the ventilation holes on the housing to ventilate and dissipate heat normally. Thus performance of dust proof of the equipment can be improved, while the heat dissipation effect of the equipment will not be affected, thus improving the reliability of the circuit board of the equipment and prolonging its service life.

In another embodiment of the present disclosure, the driving mechanism comprises a stepping motor which connected with the movable baffle through a transmission mechanism.

Where the movable baffle has the structure of shutter, the driving mechanism can be a stepping motor connected with the movable baffle through the transmission mechanism, when the electronic equipment is powered on, the driving mechanism receives a switch signal, the stepping motor drives the movable baffle to rotate, so that the ventilation holes on the housing are not shielded by the movable baffle, and the interior of the electronic equipment communicates with the external environment, and the ventilation holes can ventilate and dissipate heat normally, and when the electronic equipment is powered off, the driving mechanism receives a switch signal, the stepping motor drives the movable baffle reversely, so that the ventilation holes are shielded by the movable baffle.

This embodiment sets two ends of the step size of the stepping motor correspond to the first and second states of the movable baffle, as the stepping motor steps forward by one step size, the movable baffle is switched from the first state to the second state. Alternatively, the switch between the first state and the second state of the movable baffle is realized only by forward and backward rotation of the stepping motor, thus improving the performance of dust proof of the equipment without affecting the heat dissipation effect of the equipment, thereby improving the reliability of the circuit board of the equipment and prolonging its service life.

It should be noted that, on the premise of no conflict, the technical features in this embodiment can be combined in any manner.

What are described above is related to the illustrative embodiments of the disclosure only and not limitative to the scope of the disclosure, the scopes of the disclosure are defined by the accompanying claims.

This disclosure claims the benefit of Chinese patent application No. 201520039825.4, filed Jan. 20, 2015, the disclosure of which is hereby incorporated herein by reference in its entirety.

The invention claimed is:

1. An electronic equipment, comprising: a housing provided with ventilation holes, and a movable baffle;
wherein where the electronic equipment is not in operation, the movable baffle is in a first state, the ventilation holes on the housing are shielded by the movable baffle; and where the electronic equipment is in operation, the movable baffle is moved to a second state to enable the ventilation holes on the housing to ventilate and dissipate heat normally; and
wherein the movable baffle has a structure of shutter; where the movable baffle is in the first state, the movable baffle corresponds to a closed state of the shutter, and the ventilation holes on the housing are closed; and where the movable baffle is moved to the second state, the movable baffle corresponds to an open state of the shutter, and the ventilation holes on the housing are open;
wherein the electronic equipment further comprises a driving mechanism which controls the movable baffle to be switched between the first state and the second state, wherein the driving mechanism comprises:
a coil;
a control component which controls whether the coil is powered or not;

a magnet provided on one end of the movable baffle adjacent to the coil and rigidly connected with the movable baffle;

a spring, one end of which is fixed and the other end of which is connected with the other end of the movable baffle away from the magnet; and a stop post, wherein where the movable baffle is at the position defined by the stop post, the movable baffle is in the second state, and where the spring is in an initial position, the movable baffle is in the first state.

2. The electronic equipment of claim 1, wherein the movable baffle is provided with through holes corresponding to the ventilation holes;

where the movable baffle is in the first state, the position of the through holes on the movable baffle is staggered the position of the ventilation holes on the housing; and where the movable baffle is moved to the second state, the position of the through holes on the movable baffle and the position of the ventilation holes on the housing are coincided to each other, and the ventilation holes on the housing ventilates and dissipates heat normally.

3. The electronic equipment of claim 1, wherein the stop post is a column shaped protrusion provided on the housing and is provided on a moving path of the movable baffle.

4. The electronic equipment of claim 3, wherein the housing and the column shaped protrusion provided on the housing are formed integrally.

5. The electronic equipment of claim 1, wherein the driving mechanism comprises: a stepping motor connected with the movable baffle through a transmission mechanism.

6. The electronic equipment of claim 1, wherein the electronic equipment is a TV set or a display.

7. The electronic equipment of claim 1, wherein the stop post is a column shaped protrusion provided on the housing and is provided on a moving path of the movable baffle.

8. The electronic equipment of claim 7, wherein the housing and the column shaped protrusion provided on the housing are formed integrally.

9. The electronic equipment of claim 1, wherein the driving mechanism comprises: a stepping motor connected with the movable baffle through a transmission mechanism.

* * * * *